United States Patent
Choi et al.

(10) Patent No.: US 7,304,367 B2
(45) Date of Patent: Dec. 4, 2007

(54) METAL-INSULATOR-METAL CAPACITORS INCLUDING TRANSITION METAL SILICIDE FILMS ON DOPED POLYSILICON CONTACT PLUGS

(75) Inventors: Jae-hyoung Choi, Gyeonggi-do (KR); Jung-hee Chung, Seoul (KR); Cha-young Yoo, Gyeonggi-do (KR); Nam-myun Cho, Seoul (KR); Jeong-sik Choi, Seoul (KR); Se-hoon Oh, Gyeonggi-do (KR); Dong-kyun Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 209 days.

(21) Appl. No.: 10/870,745

(22) Filed: Jun. 17, 2004

(65) Prior Publication Data

US 2005/0023640 A1 Feb. 3, 2005

(30) Foreign Application Priority Data

Jun. 17, 2003 (KR) .................... 10-2003-0039128

(51) Int. Cl.
*H01L 29/00* (2006.01)

(52) U.S. Cl. .................... 257/532; 257/309; 257/306
(58) Field of Classification Search ............ 257/532, 257/309, 306
See application file for complete search history.

(56) References Cited

U.S. PATENT DOCUMENTS

| 6,344,964 | B1* | 2/2002 | Adler | 361/306.3 |
| 6,436,787 | B1* | 8/2002 | Shih et al. | 438/396 |
| 6,949,427 | B2* | 9/2005 | Chen et al. | 438/253 |
| 2003/0032234 | A1* | 2/2003 | Suzuki | 438/239 |
| 2003/0203633 | A1* | 10/2003 | Sinha | 438/692 |

* cited by examiner

*Primary Examiner*—Thanh Nguyen
(74) *Attorney, Agent, or Firm*—Myers, Bigel, Sibley & Sajovec, P.A.

(57) ABSTRACT

A MIM capacitor can include a doped polysilicon contact plug in an interlayer insulating film. A lower electrode of the MIM capacitor includes a transition metal nitride film is on the doped polysilicon contact plug. A transition metal silicide film is between the doped polysilicon contact plug and the transition metal nitride film.

9 Claims, 10 Drawing Sheets 200 120 171

METAL-INSULATOR-METAL CAPACITORS INCLUDING TRANSITION METAL SILICIDE FILMS ON DOPED POLYSILICON CONTACT PLUGS

CROSS-REFERENCE TO RELATED APPLICATION

This application claims the priority of Korean Patent Application No. 2003-39128 filed on Jun. 17, 2003, in the Korean Intellectual Property Office, the disclosure of which is incorporated herein by reference in its entirety.

FIELD OF THE INVENTION

The invention relates to metal-insulator-metal capacitors and methods of forming the same.

BACKGROUND

As the integration density of integrated circuit memory devices (i.e., semiconductors) increases, the capacitance of associated capacitor therein can be increased by reducing the thickness of an equivalent oxide ($T_{ox}$) of a dielectric film while maintaining a relatively low leakage current. However, in the case of an Metal-insulator-Semiconductor (MIS) structure, a surface of a polysilicon lower electrode may be oxidized by air to form an oxide film thereon. Accordingly, the thickness of the equivalent oxide $T_{ox}$ of the dielectric film may increase, thereby causing a leakage current at the interface between the lower electrode and the dielectric film.

The above problem has been addressed by using a high dielectric material, decreasing the capacitance constant and using a relatively high work function metal film (such as TiN, TaN, or W) rather than polysilicon for the lower electrode. When the lower electrode is formed of such a metal, the thickness of the equivalent oxide $T_{ox}$ of the dielectric film may be reduced, and the leakage current may also be decreased.

Typically, the lower electrode of a capacitor in a memory device is electrically coupled to a source (or contact pad) of a MOS transistor via a contact plug, which generally is a doped polysilicon film. When the lower electrode (made of one of the above metals) is formed on the polysilicon contact plug, the contact resistance may be increased due to the lack of an ohmic contact between the lower electrode and the contact plug. In this case, the surface of the polysilicon contact plug may be oxidized, thereby increasing thickness of the equivalent oxide $T_{ox}$.

The above problem associated with oxidation has been addressed by replacing the polysilicon contact plug with a metal contact plug. However, a metal contact plug and the polysilicon plug are typically formed using different steps. Accordingly, forming the contact plug as a metal contact plug may require additional manufacturing equipment. For example, in some situations polysilicon contact plugs and resistor (that can act signal delays in a semiconductor memory device) can be formed during the same step in manufacturing process. However, if the contact plug is formed of metal, the process for forming the metal contact plug and the process for forming the resistor may need to be performed separately, thereby, possibility complicating the process by, for example, adding photolithography steps to the process.

SUMMARY

Embodiments according to the invention can provide Metal-Insulator-Metal (MIM) capacitors including metal silicide films on doped polysilicon contact plugs and methods of forming the same. Pursuant to these embodiments, a MIM capacitor can include a doped polysilicon contact plug in an interlayer insulating film. A lower electrode of the MIM capacitor includes a transition metal nitride film is on the doped polysilicon contact plug. A transition metal silicide film is between the doped polysilicon contact plug and the transition metal nitride film.

In some embodiments according to the invention, the transition metal nitride film can include a first transition metal nitride film that forms an inner sidewall of the lower electrode. The lower electrode can further include a second transition metal nitride film that includes an outer sidewall of the lower electrode. A metal film is between the inner and outer sidewalls of the lower electrode.

In some embodiments according to the invention, a portion of the first transition metal nitride film extends from the inner sidewall to a bottom portion of the lower electrode directly on the transition metal silicide film. The second transition metal nitride film is absent from the bottom portion.

In some embodiments according to the invention, a combined thickness of the inner sidewall, the outer sidewall, and the metal nitride film can be about 250 Angstroms to about 350 Angstroms. In some embodiments according to the invention, the inner sidewall, the outer sidewall, or the metal nitride film can have a thickness of about 80 Angstroms to about 120 Angstroms. In some embodiments according to the invention, the first and second transition metal nitride film can be the same material.

In some embodiments according to the invention, the first and second transition metal nitride film can include TiN, WN, TaN, and/or CoN. In some embodiments according to the invention, the metal film can include Ti, W, Ta, and/or Co.

In some embodiments according to the invention, the transition metal silicide film can include a transition metal component and the first or second transition metal nitride film can include the transition metal component. In some embodiments according to the invention, the transition metal film and the second transition metal nitride film can extend on the inner sidewall toward the interlayer insulating film beyond an interface between the inner sidewall and the transition metal silicide film.

In some embodiments according to the invention, a MIM capacitor can include a substrate having an interlayer insulating film thereon. A contact plug can include doped polysilicon on a portion of the interlayer insulating film. A lower electrode can include a bottom portion that is electrically coupled to the contact plug, and a sidewall that extends vertically from the bottom portion. A transition metal silicide film can be between the bottom portion of the lower electrode and the contact plug, wherein the sidewall and the bottom portion include a transition metal nitride film, and a thickness of the sidewall can be greater than a thickness of the bottom portion.

In some method embodiments according to the invention, a MIM capacitor can be formed by forming an interlayer insulating film on a substrate and forming a contact plug made including doped polysilicon film on a portion of the interlayer insulating film. An etch stopper and a mold oxide film are sequentially formed on the contact plug and the interlayer insulating film. A lower electrode region can be formed by etching the mold oxide film and the etch stopper until a surface of the contact plug is exposed. A lower electrode can be formed on the lower electrode region, wherein the lower electrode includes a bottom portion and a sidewall portion extending from both edges of the bottom portion, a surface of which can be formed of a transition metal nitride film, and a thickness of the bottom portion is less than a thickness of the sidewall portion.

In some embodiments according to the invention, a MIM capacitor can be formed by forming an interlayer insulating film on a substrate and forming a contact plug including a doped polysilicon film on a portion of the interlayer insulating film. An etch stopper and a mold oxide film can be sequentially formed on the contact plug and the interlayer insulating film. A lower electrode region can be formed by etching the mold oxide film and the etch stopper until a surface of the contact plug is exposed. A spacer can be formed including a first transition metal nitride film on sidewalls of the lower electrode region. A transition metal film can be deposited on the mold oxide film and a surface of the lower electrode region on which the transition metal film is formed at a temperature greater than a temperature at which the transition metal film and silicon react, to provide a transition metal silicide film on an exposed surface of the contact plug. A second transition metal nitride film can be deposited on a surface of the transition metal film and the transition metal silicide film.

DETAILED DESCRIPTION OF EMBODIMENTS ACCORDING TO THE INVENTION

Figure 1:
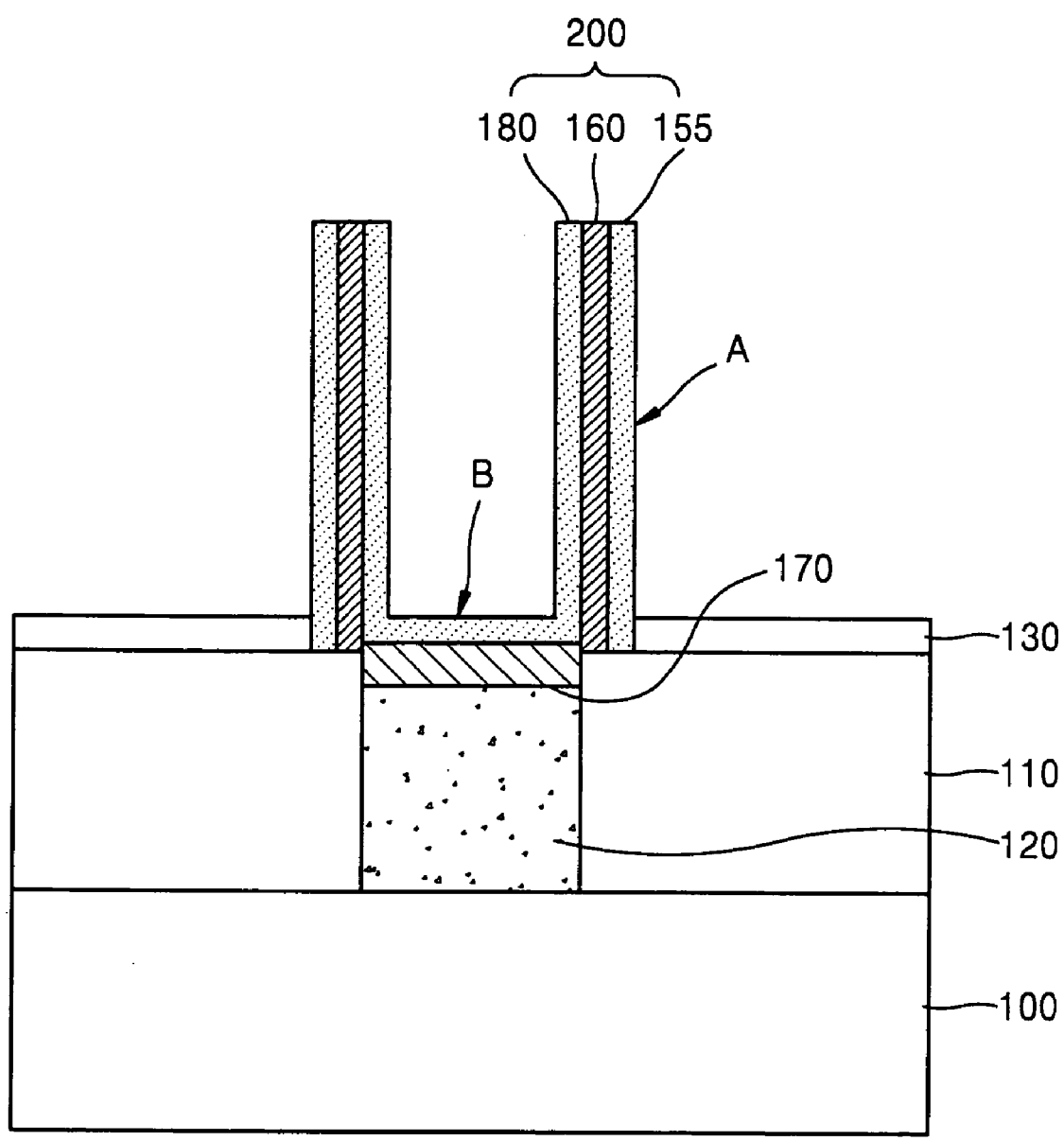
FIG. 1 is a cross-sectional view of a metal-insulator-metal (MIM) capacitor according to some embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-sectional schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Referring to FIG. 1, an interlayer insulating film 110 is formed on a substrate (e.g., silicon substrate) 100 on which a MOS transistor (not shown), a contact pad (not shown), a bit line (not shown), and an insulating film (not shown) are formed. A contact plug 120 electrically connected to a source of the MOS transistor is formed on a portion of the interlayer insulating film 110. In some embodiments according to the invention, the contact plug 120 is a doped poly silicon film.

A lower electrode 200 on the interlayer insulating film 110 contacts the contact plug 120. In some embodiments according to the invention, the lower electrode 200 is a cylindrical or concave shape that includes a bottom portion B that is formed on the contact plug 120 and sidewall portions A that vertically extend from the bottom portion B away from the interlayer insulating film 110. In some embodiments according to the invention, the bottom portion B include a metal. An inner wall and outer wall of each of the sidewall portions A of the lower electrode 200 can be formed of a metal film having a low reactivity with oxygen, such as a transition metal nitride film.

In some embodiments according to the invention, the sidewall portions A of the lower electrode 200 include a spacer 155 formed of a first transition metal nitride film, a transition metal film 160, and a second transition metal nitride film 180. In some embodiments according to the invention, the bottom portion B of the lower electrode 200 includes the second transition metal nitride film 180 extending between opposite portions of the sidewall portions A. The spacer 155 (the first transition metal nitride film) and the second transition metal nitride films 180 can be TiN, WN, TaN, and/or CoN, and the transition metal film 160 can be Ti, W, Ta, and/or Co.

In some embodiments according to the invention, a combined thickness of the sidewall portion A of the lower electrode 200 is from about 250 Angstroms to about 350 Angstroms, and the thickness of each of the first transition metal nitride film, the transition metal film 160, and the second transition metal nitride film 180 is from about 80 Angstroms to about 120 Angstroms. The spacer 155 and the second transition metal nitride film 180 may be the same film material, and the transition metal film 160 may be or may not be the same transition metal component included in the spacer 155 and in the second transition metal nitride film 180

In some embodiments according to the invention, inner and outer surfaces of the sidewall portion A of the cylinder can be formed of a single transition metal film. However, because a native oxide film may be on the transition metal film through a reaction with oxygen, the inner and outer surfaces of the sidewall portion A and the bottom portion B, the surface of the lower electrode 200 can be formed of a transition metal nitride film having a relatively low reactivity with oxygen.

A transition metal silicide film 170 is located at an interface between the lower electrode 200 and the contact plug 120 and may act as an ohmic contact layer. In some embodiments according to the invention, the transition metal component in the transition metal silicide film 170 can be the same as the transition metal component in the sidewall section A. For example, in some embodiments according to the invention, if the transition metal film 160 is Ti, the transition metal silicide film 170 is $TiSi_2$.

An etch stopper 130 is formed on the interlayer insulating film 110 on both sides of the lower electrode 200, and can be formed of a silicon nitride film ($Si_3N_4$). The MIM capacitor can further include a high dielectric film and an upper electrode (not shown) formed on the lower electrode 200 and the etch stopper 130.

Figure 2A:
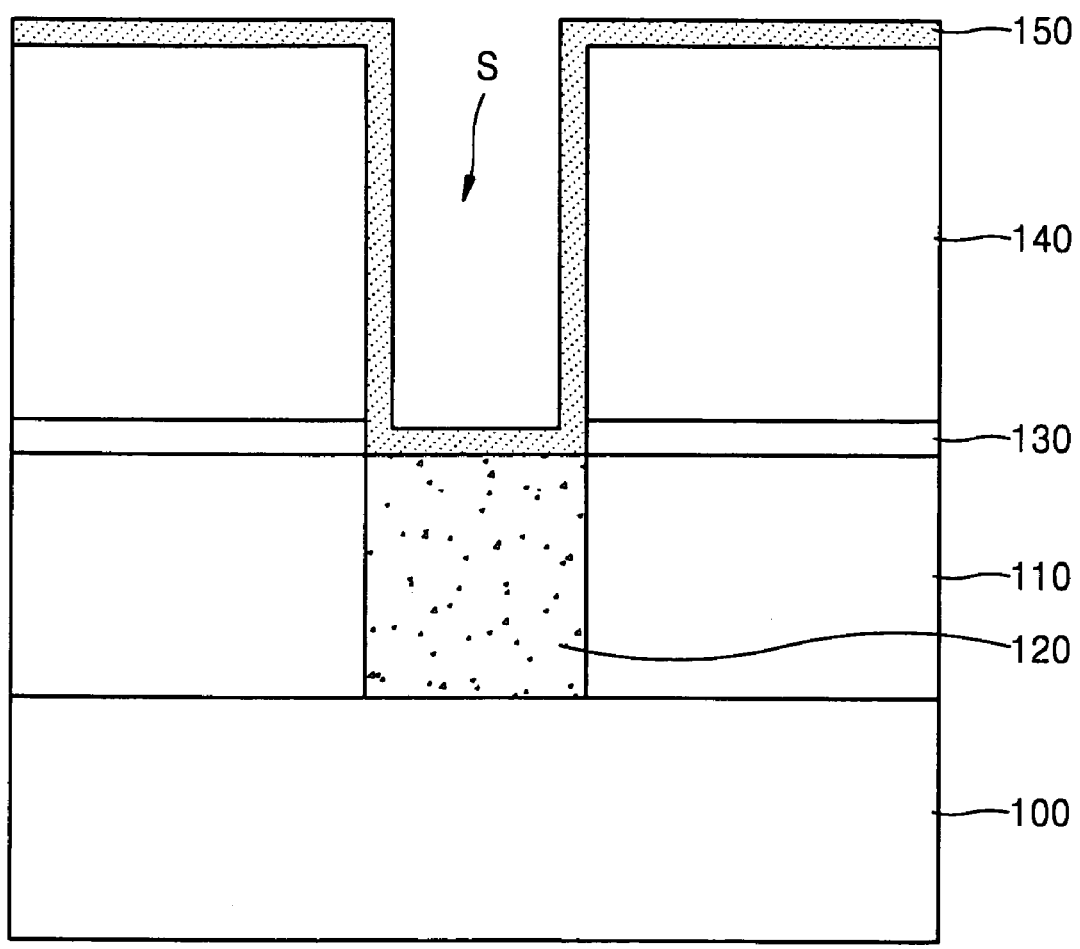
FIGS. 2A through 2D are cross-sectional views illustrating methods of forming MIM capacitors according to some embodiment of the invention.

Methods of forming a lower electrode of a MIM capacitor according to some embodiments of the invention are described with reference to FIG. 2A-2D. Referring to FIG. 2A, an interlayer insulating film 110 is formed on a substrate 100. As described above, a MOS transistor (not shown) including a gate, a source/drain, a contact pad (not shown) contacting the source/drain, a bit line, and an insulating film can be formed on the substrate 100. In some embodiments according to the invention, the interlayer insulating film 110 is a silicon oxide film.

A contact hole (not shown) is formed to expose the contact pad on the source/drain by etching a portion of the interlayer insulating film 110. A doped polysilicon film is deposited to fill the contact hole, and the doped polysilicon film is planarized until a surface of the interlayer insulating film 110 is exposed using, for example, chemical mechanical polishing (CMP) or an etch back, thereby forming a contact plug 120.

An etch stopper 130 and a mold oxide film 140 are formed on the interlayer insulating film 110 and on the contact plug 120. The etch stopper 130 is a film having an etch selectivity relative to the mold oxide film 140 and the interlayer insulating film 110. In some embodiments according to the invention, the etch stopper is a silicon nitride film. In some embodiments according to the invention, the mold oxide film 140 is an oxide film that can be removed using a wet chemical, such as a chemical vapor deposition (CVD) oxide film or a spin-on-glass (SOG) film.

An electrode region S is defined by etching the mold oxide film 140 and the etch stopper 130 to expose the contact plug 120. A first transition metal nitride film 150 is formed on a surface of the electrode region S and on the mold oxide film 140. In some embodiments according to the invention, the first transition metal nitride film 150 is TiN, WN, TaN, and/or CoN. In the exemplary embodiment of the invention described herein, a TiN film was used. In some embodiments according to the invention, the first transition metal nitride film 150 is formed by CVD at a temperature of about 500 degrees Centigrade to about 700 degrees Centigrade. In some embodiments according to the invention, the first transition metal nitride film 150 is formed by atomic layer deposition (ALD) at a temperature of about 300 degrees Centigrade to about 600 degrees Centigrade. In some embodiments according to the invention, the thickness of the first transition metal nitride film 150 is about 80 Angstroms to about 120 Angstroms.

Figure 2B:
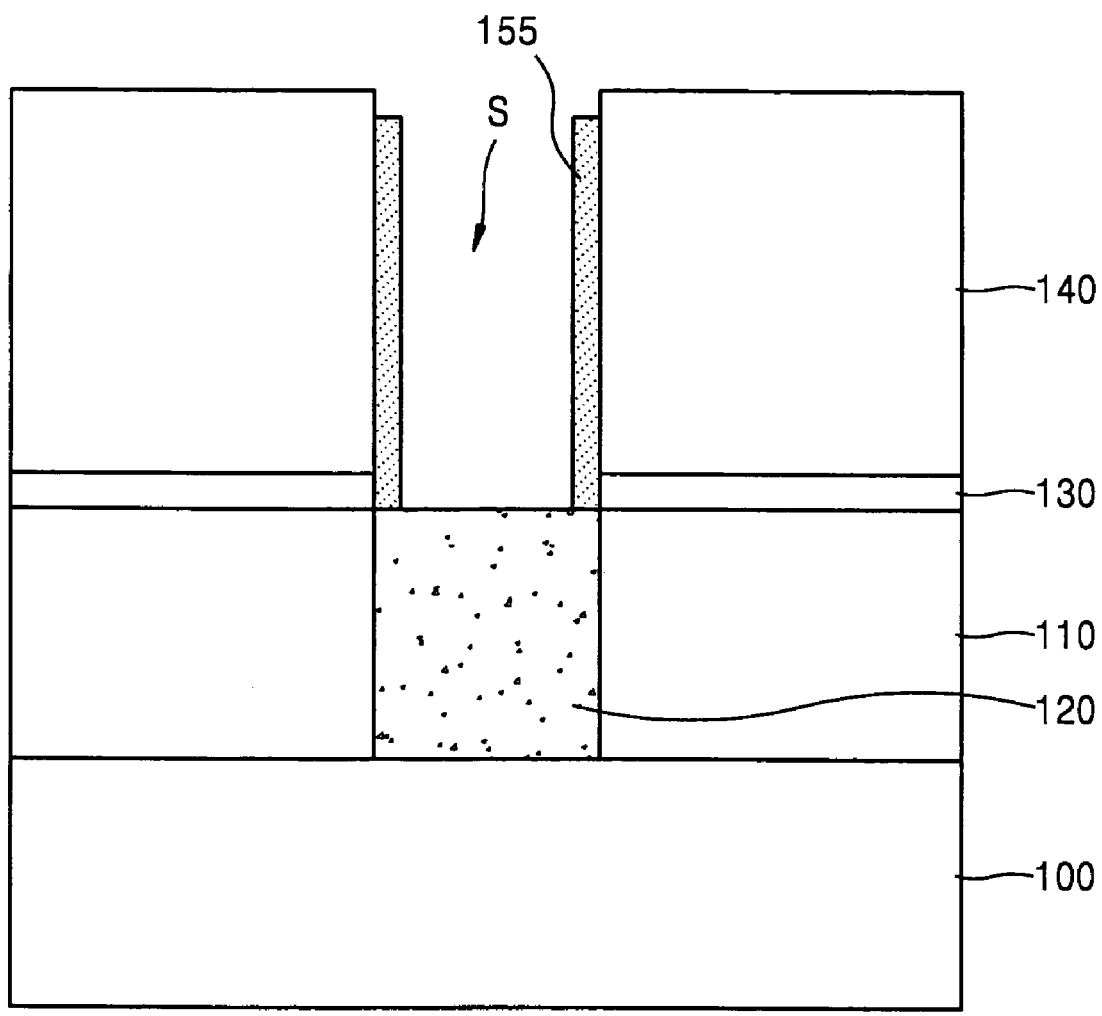

Referring to FIG. 2B, a spacer 155 is formed by anisotropic etching the first transition metal nitride film 150 until a surface of the mold oxide film 140 and a surface of the contact plug 120 are exposed. In some embodiments according to the invention, a portion of the first transition metal nitride film 150 on an upper portion of the sidewall of the electrode region S can be removed using dry etching. Accordingly, in some embodiments according to the invention, a height of the spacer 155 is lower than a surface of the mold oxide film 140 at a mouth of the region S.

Figure 2C:
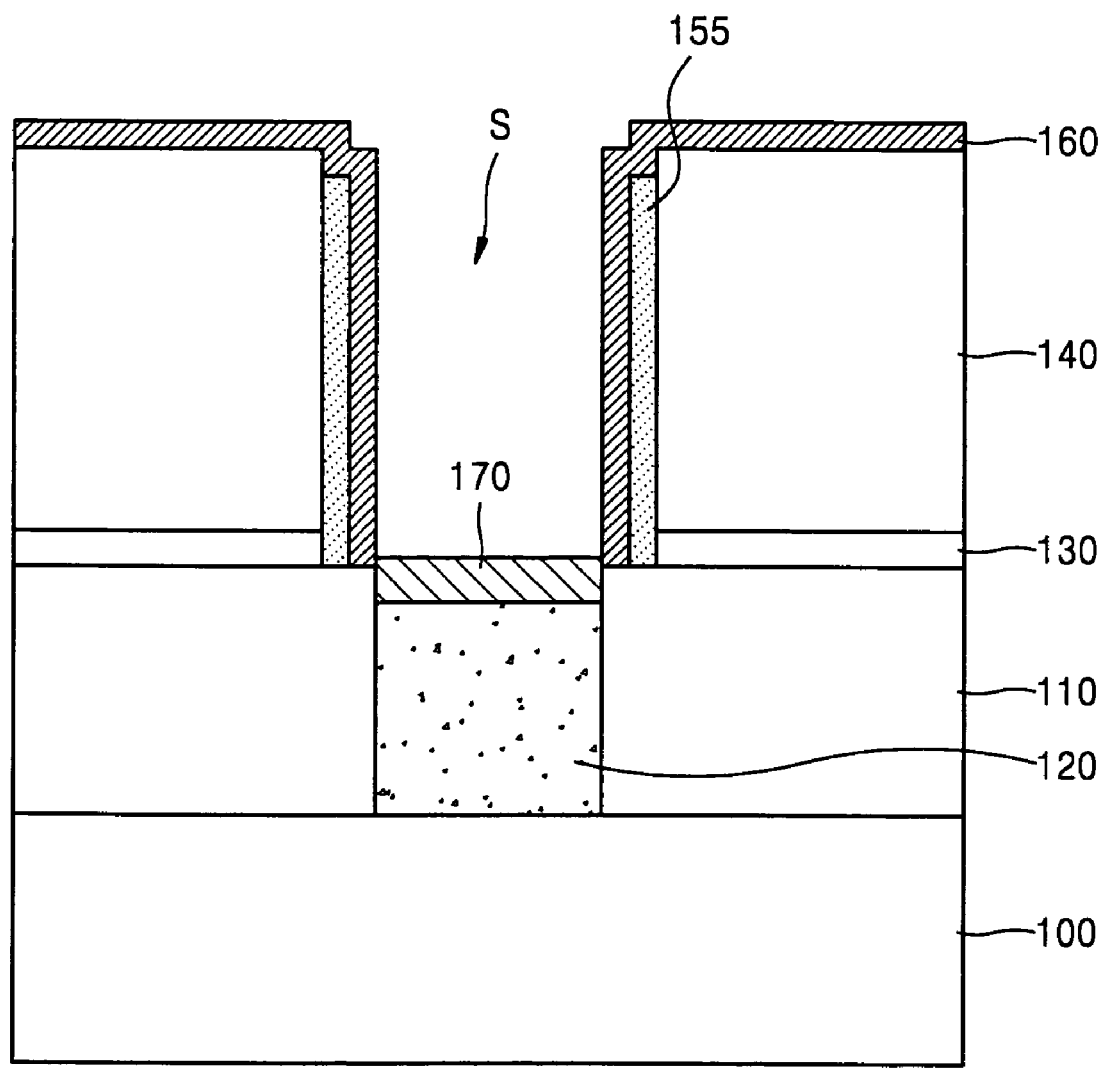

Referring to FIG. 2C, a transition metal film 160 is formed on the mold oxide film 140 and the electrode region S, i.e., on surfaces of the spacer 155 and the contact plug 120 to a thickness of about 80 Angstroms to about 100 Angstroms. In some embodiments according to the invention, the transition metal film 160 is formed of a metal, such as Ti, W, Ta, and/or Co, using a CVD method. In some embodiments according to the invention, the CVD method is a plasma enhanced chemical vapor deposition (PECVD) process or a metal organic chemical vapor deposition (MOCVD) process, performed at a temperature of about 600 to about 700 degrees Centigrade. In some embodiments according to the invention, the transition metal film 160 is deposited at a temperature that is greater than about 600 degrees Centigrade, where the transition metal reacts with polysilicon. The reaction of the metal with the polysilicon forms a transition metal silicide film 170 on the surface of the contact plug 120. In some embodiments according to the invention, a rapid thermal nitridation (RTN) process is performed to reduce the resistance of the transition metal silicide film 170. In some embodiments according to the invention, a Ti film is used (rather than the transition metal film 160) and a $TiSi_2$ film is used as the transition metal silicide film 170.

In some embodiments according to the invention, the transition metal film 160 is deposited in a temperature range of about 400 degrees Centigrade to about 600 degrees Centigrade, and the transition metal silicide film 170 is formed on the contact plug 120 by performing an additional heat treatment process.

Figure 2D:
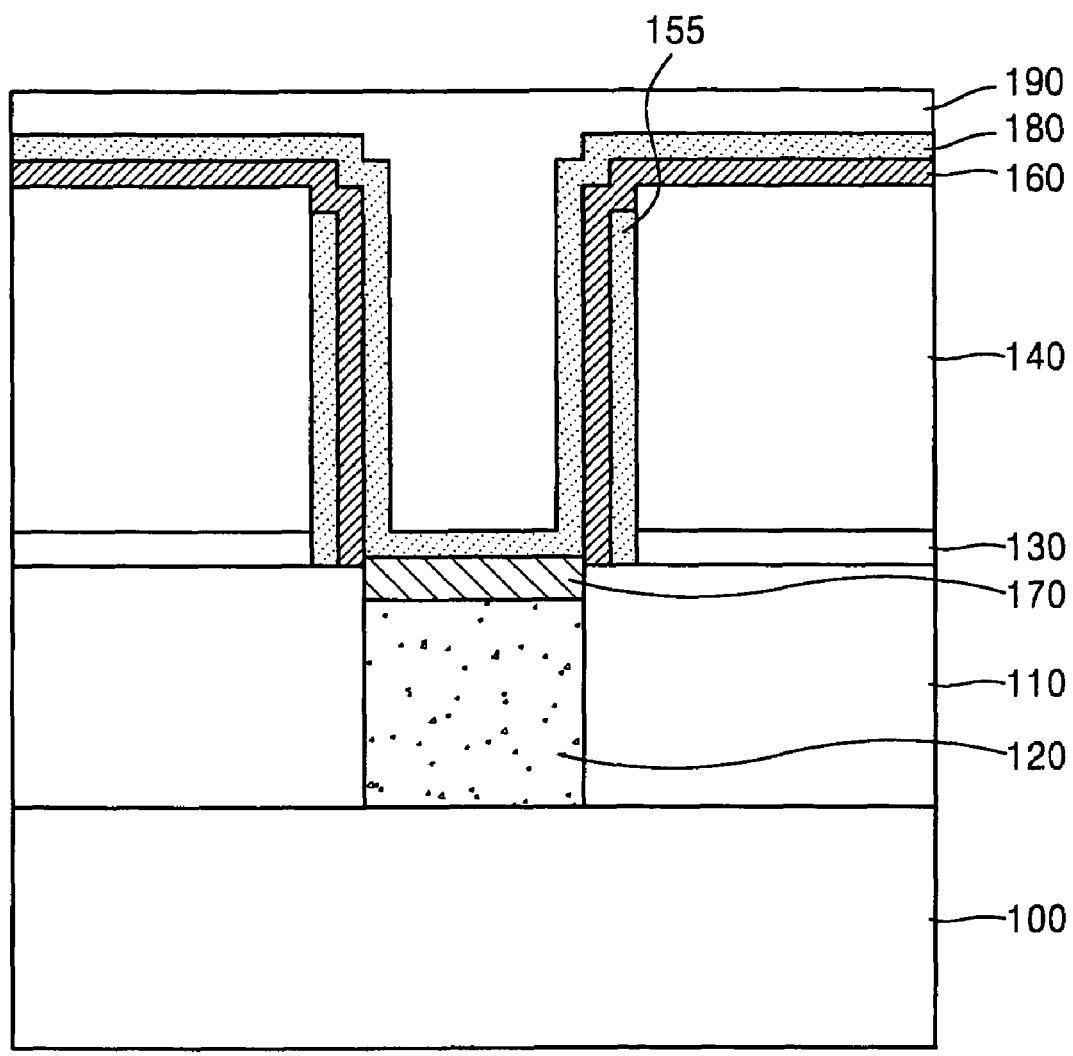

Referring to FIG. 2D, a second transition metal nitride film 180 is the deposited on the transition metal film 160 and the transition metal silicide film 170. In some embodiments according to the invention, the second transition metal nitride film 180 is formed of a material, such as TiN, WN, TaN and/or CoN. In some embodiments according to the invention, the second transition metal nitride film 180 is same material used for the first transition metal nitride film 150. In some embodiments according to the invention, the second transition metal nitride film 180 is formed using CVD or PECVD at a temperature between about 650 degrees Centigrade and about 750 degrees Centigrade. In some embodiments according to the invention, the transition metal film 160 is deposited at a temperature greater than about 600 degrees Centigrade, and the second transition metal nitride film 180 is formed in-situ with the transition metal film 160. In some embodiments according to the invention, when the transition metal film 160 is deposited at a temperature less than about 600 degrees Centigrade, the transition metal film 160 and the second transition metal nitride film 180 can be formed ex-situ. In some embodiments according to the invention, the second transition metal nitride film 180 is formed to a thickness in a range between about 80 Angstroms to about 120 Angstroms.

A sacrificial layer 190 is deposited on the second transition metal nitride film 180 and the electrode region S. In some embodiments according to the invention, the sacrificial layer 190 fills the electrode region S. In some embodiments according to the invention, the sacrificial layer 190 is a silicon oxide film that is wet etched at a rate similar to that rate at which the mold oxide film 140 is etched. In other words, the silicon oxide film and the mold oxide film 140 can etch at about the rate using a the same etchant.

Referring again to FIG. 1, the sacrificial layer 190, the second transition metal nitride film 180, and the transition metal film 160 are planarized using a CMP process or an etch back process, thereby forming a lower electrode 200 that includes the spacer 155, the transition metal film 160, and the second transition metal nitride film 180. In some embodiments according to the invention, the sacrificial layer 190 and the mold oxide film 140 are removed by soaking the resulting product in a wet etching chemical that removes the silicon oxide film. A high dielectric film (not shown) and an upper electrode (not shown) are sequentially formed.

Figure 3:
FIG. 3 is a scanning electron microscope (SEM) image a lower electrode of an MIM capacitor formed according to some embodiment of the invention.

FIG. 3 is a SEM image of an exemplary MIM capacitor formed according to some embodiments of the invention. The SEM image shows an exemplary MIM capacitor in which the transition metal silicide film 170 has been removed by wet etching. In particular, a space 171 between the lower electrode 200 and the polysilicon contact plug 120 indicates the region where the transition metal silicide film 170 was formed. According to FIG. 3, the transition metal silicide film 170 was formed between the contact plug 120 and the lower electrode 200, and the contact plug 120 and the lower electrode 200 are in ohmic contact with the transition metal silicide film 170.

In the lower electrode 200 of the MIM capacitor according to the invention, the contact plug 120 is formed of a doped polysilicon film, the lower electrode 200 is formed of the transition metal nitride 155 and 180 and the transition metal nitride film 160, and the transition metal silicide film 170 is formed between the contact plug 120 and the lower electrode 200. Accordingly, the polysilicon contact plug 120 and the lower electrode 200 are in ohmic contact with one another via the transition metal silicide film 170 therebetween. Accordingly, a contact resistance (and leakage current) at the interface may be reduced, and manufacturing costs may also be reduced since additional equipment for a new process may not be require.

Also, generation of a native oxide may be reduced since the lower electrode 200 is formed of a metal, rather than, for example, polysilicon. Therefore, the thickness of an equivalent oxide $T_{ox}$ of a dielectric film (not shown), formed in a subsequent process, can be reduced. Furthermore, the leakage current may also be reduced.

When the transition metal nitride film, such as a TiN film, is deposited on the insulating film, as is sometimes done in conventional approaches, a rough surface may be formed. However, in some embodiments according to the invention, the second transition metal nitride film 180 is formed on a surface of the transition metal film 160, therefore enabling the inner surfaces of the cylinder to have a smoother surface, which may further reduce the leakage current.

Figure 4:
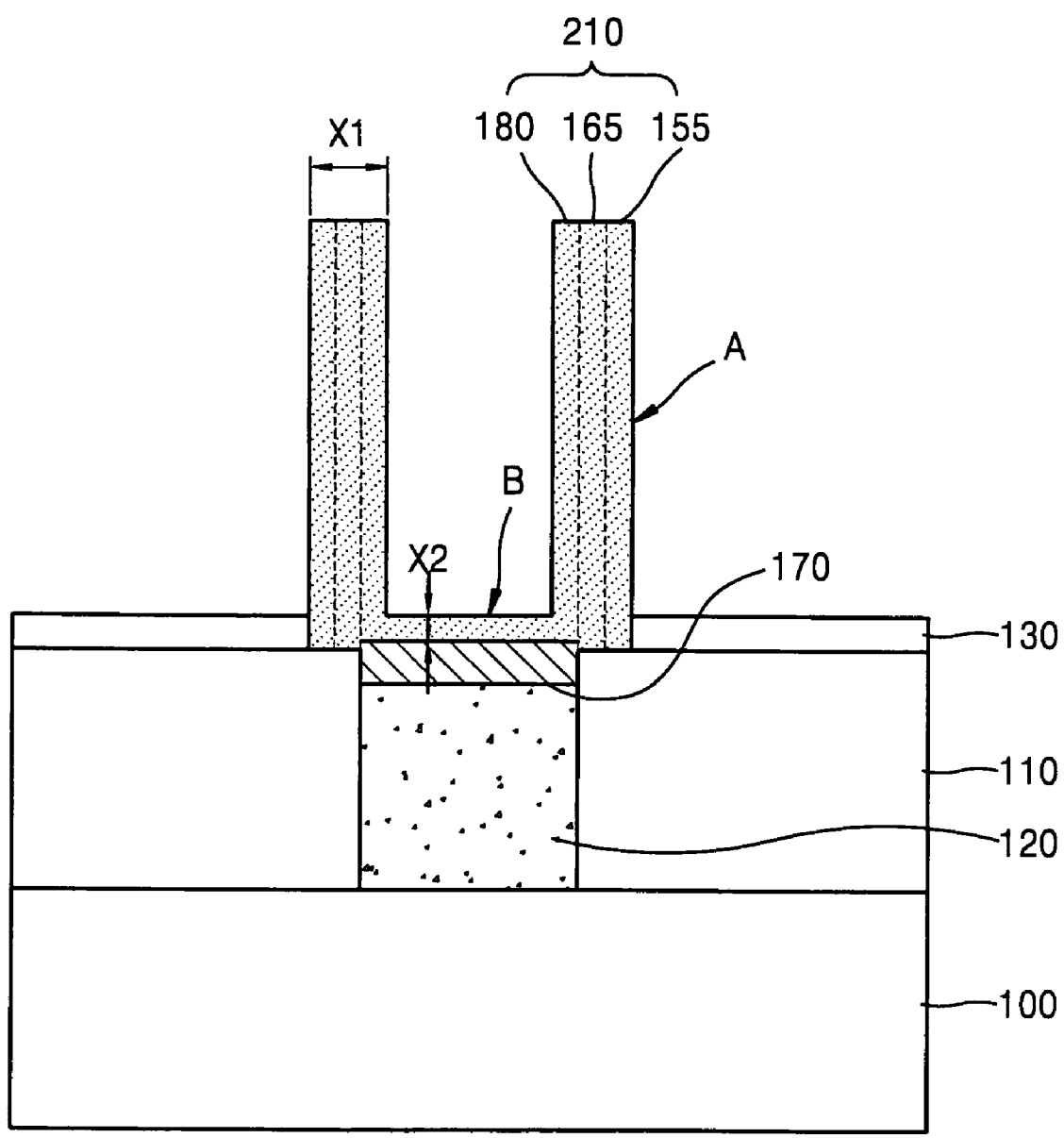
FIG. 4 is a cross-sectional view of a MIM capacitor according to some embodiments of the invention.

Referring to FIG. 4, in some embodiments according to the invention, a lower electrode 210 has a sidewall portion A and a bottom portion B and is formed on the interlayer insulating film 110. In some embodiments according to the invention, the lower electrode 210 contacts the contact plug 120. In some embodiments according to the invention, the sidewall portion A and the bottom portion B of the lower electrode are formed of a metal film having a relatively low reactivity with oxygen and contains nitrogen, such as TiN, WN, TaN, and/or CoN. In some embodiments according to the invention, the sidewall portion A of the lower electrode 210 is formed of a single layer transition metal nitride film or a multi layer transition metal nitride film, and the bottom portion B is formed of a single layer transition metal nitride film.

A thickness×1 of the sidewall portion A of the lower electrode 210 is greater than a thickness×2 of the bottom portion B. For example, the thickness×1 of the sidewall portion A can be about three times greater than the thickness×2 of the bottom portion B.

Methods of forming a MIM capacitor according to some embodiments of the invention are described below in reference to formation of features subsequent to formation of the spacer 155. Therefore, only the formation of such features is described hereinbelow, however, it will be understood that other features can be formed as described above in reference, for example, to FIGS. 1-3.

Figure 5A:
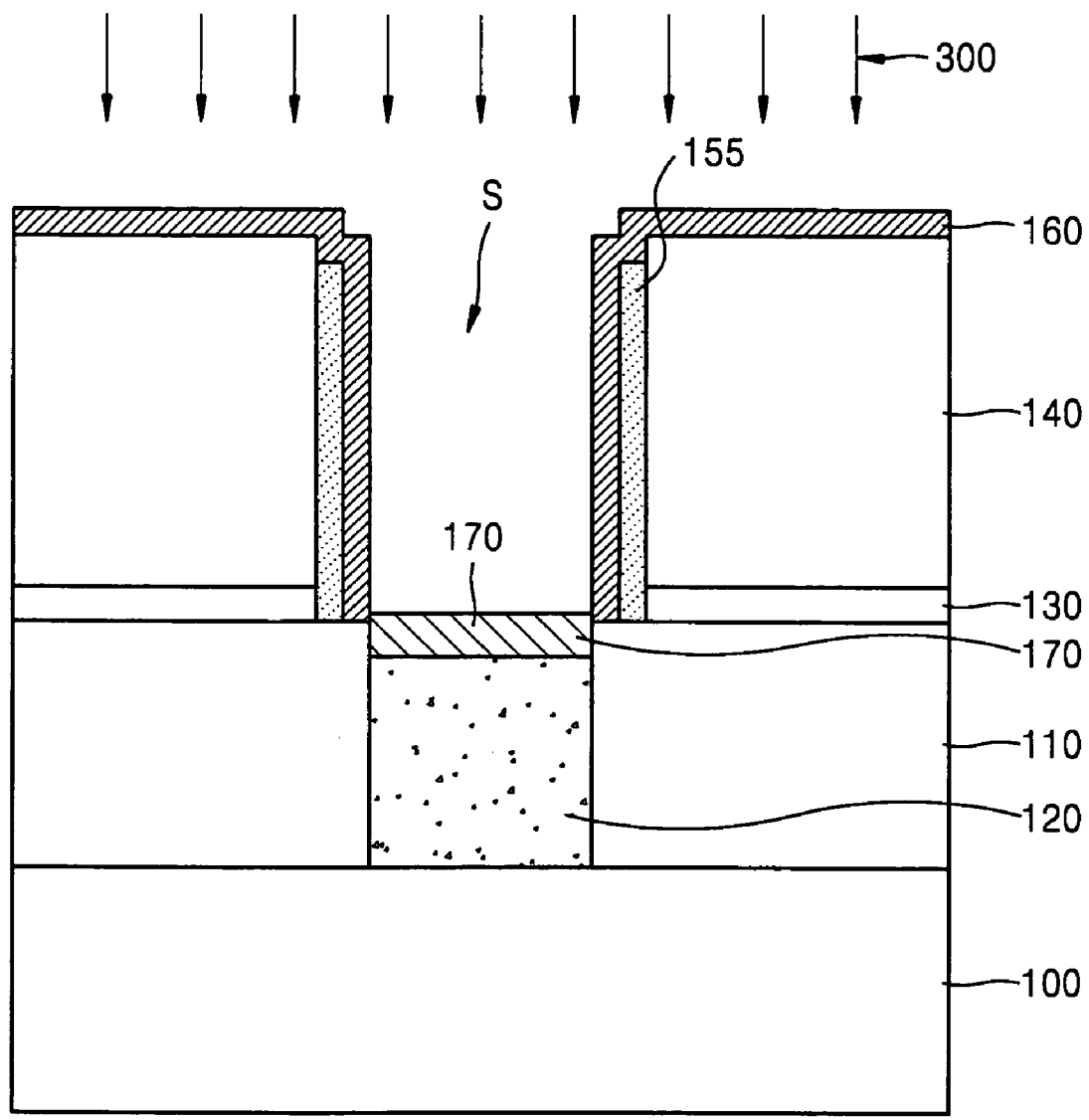
FIGS. 5A and 5B are cross-sectional views illustrating methods of forming MIM capacitors according to some embodiments of the invention.

Referring to FIG. 5A, a transition metal film 160 is deposited on the lower electrode region S, on which a spacer 155 has been formed, and on the mold oxide film 140, to a thickness in a range between about 80 Angstroms to about 100 Angstroms. In some embodiments according to the invention, the transition metal film 160 is a metal, such as, Ti, W, Ta, and/or Co, formed using CVD or PECVD at a temperature in a range from about 600 degrees Centigrade to about 700 degrees Centigrade. The transition metal film 160 can react with silicon to form a transition metal silicide film 170 on a surface of the contact plug 120.

In some embodiments according to the invention, a nitridation process (using, for example, a heat treatment or a plasma treatment) is performed in an atmosphere containing nitrogen, such as an $N_2$ or $NH_3$ gas, to promote nitridation of the transition metal film 160 to form a transformed transition metal nitride film 165. In some embodiments according to the invention, the nitridation process is performed for a time in a range from about 10 second to about 50 seconds. Reference number 300 indicates the nitridation process.

Figure 5B:
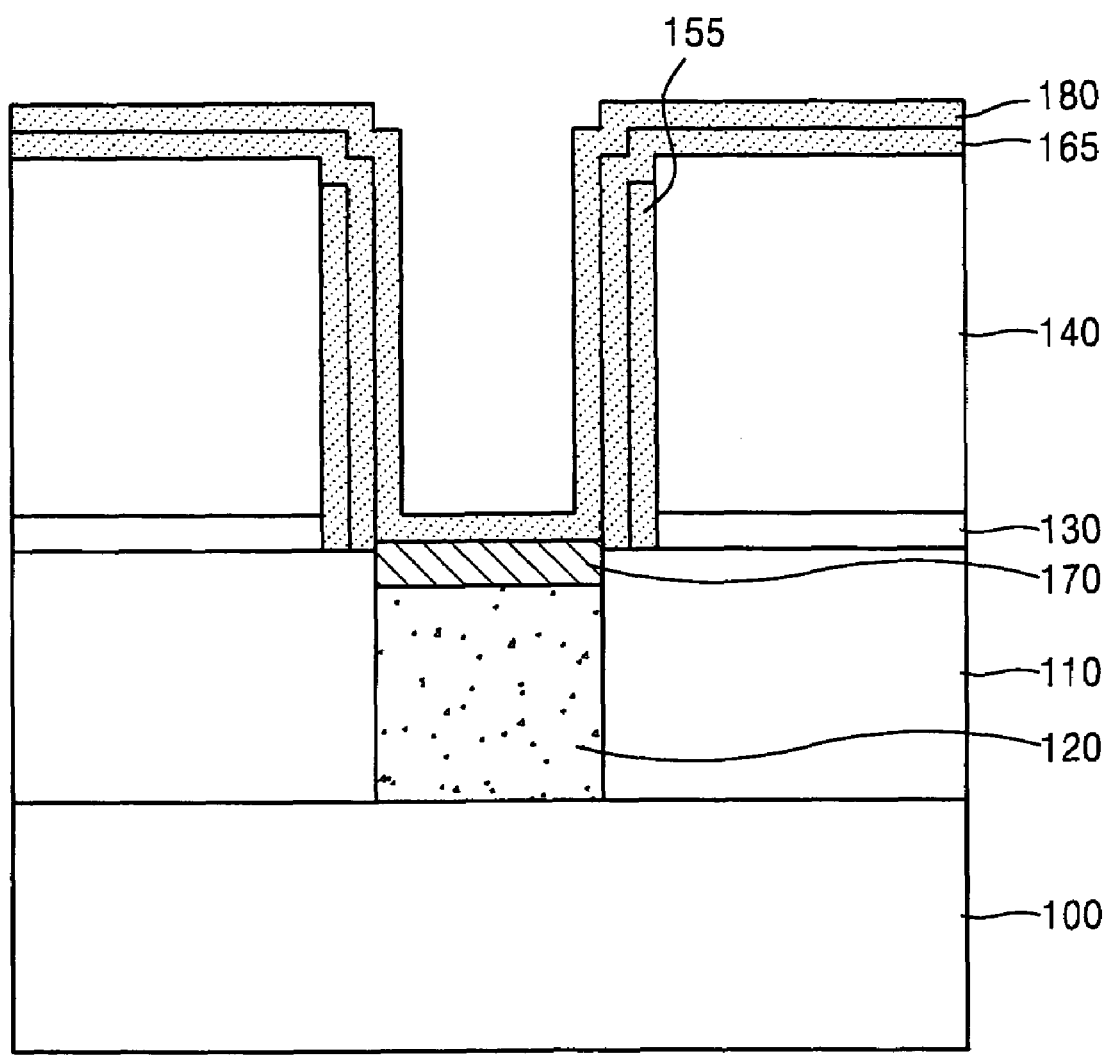

Referring to FIG. 5B, a second transition metal nitride film 180 is deposited on the transformed transition metal nitride film 165. In some embodiments according to the invention, the second transition metal nitride film 180 is formed of the same material as the first transition metal film 160 and also may be formed of the same material as the transformed transition metal nitride film 165. The second transition metal nitride film 180 and the transition metal film 160 can be transformed in-situ or ex-situ. In some embodiments according to the invention, a sacrificial layer (not shown) is formed to fill the lower electrode region S. In some embodiments according to the invention, the transition metal film 160 is nitridized after the transition metal silicide film 170 is formed on the surface of the polysilicon contact plug 120 by depositing the transition metal film 160.

Referring again to FIG. 4, the sacrificial layer, the second transition metal nitride film 180, and the transformed transition metal nitride film 165 are planarized using CMP process or an etch back process, to forming a lower electrode 210. In some embodiments according to the invention, the sacrificial layer (not shown) and the mold oxide film 140 are removed by wet etching.

Table 1 shown below includes capacitance values and ratios of the minimum capacitance (Cmin) to the maximum capacitance (Cmax) for exemplary embodiments of MIM capacitors according to the invention compared to a conventional capacitor. The exemplary embodiments of MIM capacitors according to the invention were prepared such that a lower electrode is formed according to the embodiments described above in reference to FIGS. 1-5B, the dielectric film used was a hafnium film with a thickness of 75 Angstroms, and the upper electrode was formed of TiN. The conventional capacitor included a lower electrode formed of a TiN film, a hafnium oxide film, and an upper electrode formed of a TiN film, where the lower electrode was in contact with a ploysilicon contact plug.

According to Table 1, the first sample received no heat treatment; the second sample was subject to Plasma processing in an oxygen atmosphere; the third sample was subject to sequential plasma processing in an oxygen atmosphere, and plasma processing in an $NH_3$ atmosphere; the fourth sample was subject to sequential plasma processing in an $NH_3$ atmosphere, and plasma processing in an oxygen atmosphere.

According to Table 1, the first through fourth sample embodiments of MIM capacitors according to the invention have higher capacitances than the conventional sample, and the ratios of Cmin/Cmax show no significant differences.

| Samples | capacitance (fF/cell) | Cmin/Cmax (%) |
|---|---|---|
| 1st sample | 32.14 | 98.9 |
| 2nd sample | 31.31 | 94.8 |
| 3rd sample | 30.62 | 97.1 |
| 4th sample | 31.49 | 97.3 |
| Conventional | 29.04 | 98.7 |

Figure 6:
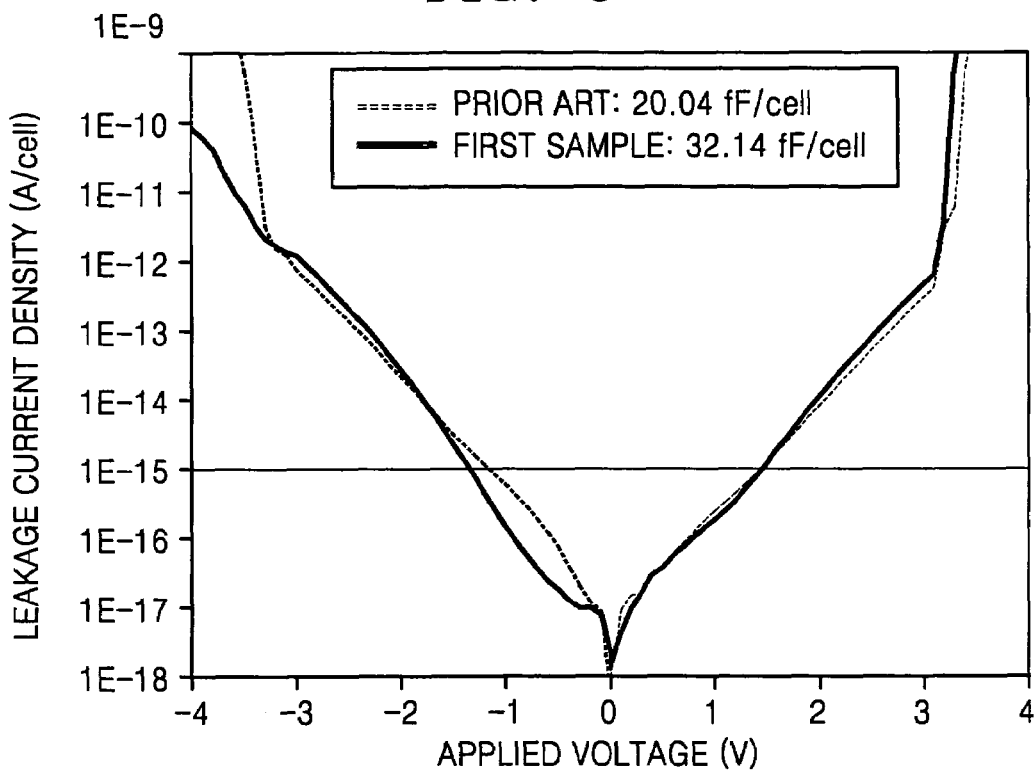
FIGS. 6 and 7 are graphs showing leakage current characteristics of MIM capacitors according to exemplary embodiments of the invention.

FIG. 6 is a graph showing leakage currents of the first sample of the MIM capacitor (from Table 1) and a conventional MIM capacitor. Referring to FIG. 6, the leakage current of the first sample of the MIM capacitor is lower than that of the conventional MIM capacitor.

Figure 7:
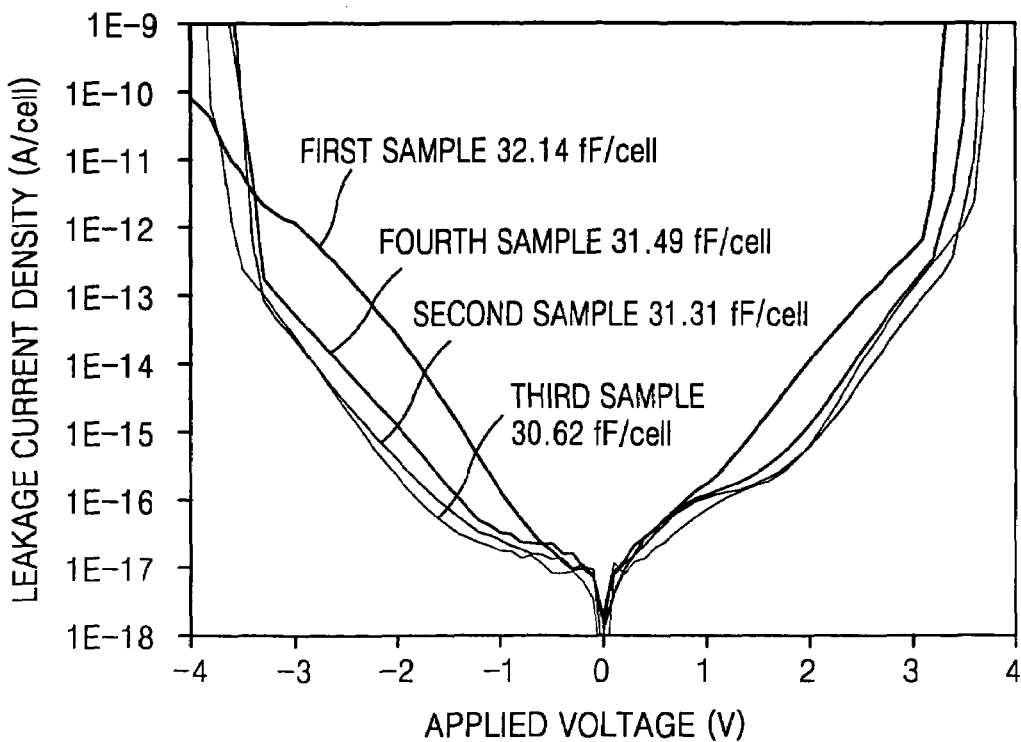

FIG. 7 is a graph showing leakage currents of the first through the fourth samples of the MIM capacitors formed according to some embodiments of the invention. Referring to FIG. 7, the first through the fourth samples of the MIM capacitors have stable leakage current profiles compared to the leakage current of the conventional MIM capacitor in FIG. 6. Particularly, the leakage current is stable when the MIM capacitor is subject to plasma processing in an oxygen and $NH_3$ atmosphere.

As described above, an ohmic contact is formed at an interface between a polysilicon contact plug and a lower electrode made of a metal by interposing a transition metal silicide film. The lower electrode includes a bottom section and a sidewall section that has a surface formed of a transition metal nitride film. Accordingly, contact characteristics, such as resistance and leakage current, between the polysilicon contact plug and the lower electrode may be improved. Moreover, manufacturing costs may be reduced as additional equipment may be unnecessary.

A thickness of an equivalent oxide and a leakage current can be reduced by forming the lower electrode with a transition metal nitride film which has a low reactivity with oxygen, because the transition metal nitride film is not conducive the formation of a natural oxide film.

The manufacturing process can be simplified because the polysilicon contact plug can be formed at the same time as the process for forming the resist of a DRAM device. A roughness of a side wall of the capacitor can be reduced because a second transition metal nitride film is formed along a surface of the transition metal film (or transition metal nitride film) in an inner wall section of the lower electrode.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A Metal-Insulator-Metal (MIM) capacitor comprising:
   a doped polysilicon contact plug in an interlayer insulating film;

a lower electrode of a MIM capacitor comprising a first transition metal nitride film on the doped polysilicon contact plug;

a transition metal silicide film between the doped polysilicon contact plug and the first transition metal nitride film, wherein the first transition metal nitride film forms an inner sidewall of the lower electrode, wherein the lower electrode further comprises:

a second transition metal nitride film comprising an outer sidewall of the lower electrode; and a metal film between the inner and outer sidewalls of the lower electrode, wherein the metal film and the second transition metal film extend on the inner sidewall toward the interlayer insulating film beyond an interface between the inner sidewall and the transition metal silicide film.

2. A MIM capacitor according to claim 1 wherein a portion of the first transition metal nitride film extends from the inner sidewall to a bottom portion of the lower electrode directly on the transition metal silicide film; and wherein the second transition metal nitride film is absent from the bottom portion.

3. A MIM capacitor according to claim 2 wherein the metal film is absent from the bottom portion.

4. A MIM capacitor according to claim 1 wherein a combined thickness of the inner sidewall, the outer sidewall, and the metal film is about 250 Angstroms to about 350 Angstroms.

5. A MIM capacitor according to claim 1 wherein the inner sidewall, the outer sidewall, or the metal film has a thickness of about 80 Angstroms to about 120 Angstroms.

6. A MIM capacitor according to claim 1 wherein the first and second transition metal nitride film comprise a same material.

7. A MIM capacitor according to claim 1 wherein the first and second transition metal nitride film comprise TiN, WN, TaN, and/or CoN.

8. A MIM capacitor according to claim 1 wherein the metal film comprises Ti, W, Ta, and/or Co.

9. A MIM capacitor according to claim 1 wherein the transition metal silicide film comprises a transition metal component and the first or second transition metal nitride film comprises the transition metal component.

* * * * *